United States Patent [19]

Karlsson

[11] 4,012,698

[45] Mar. 15, 1977

[54] DEVICE FOR OBTAINING A JITTERSTABLE SYNCHRONIZATION OF A COUNTER

[75] Inventor: Stig Erik Karlsson, Vallingby, Sweden

[73] Assignee: Telefonaktiebolaget L M Ericsson, Stockholm, Sweden

[22] Filed: Oct. 20, 1975

[21] Appl. No.: 623,772

[30] Foreign Application Priority Data

Nov. 6, 1974 Sweden .................. 74139296

[52] U.S. Cl. .................. 328/63; 178/69.1; 307/269; 328/164

[51] Int. Cl.² .................. H03K 1/17; H03K 5/13; H04L 7/00

[58] Field of Search ............ 307/269; 328/63, 164; 178/69.5 R

[56] References Cited

UNITED STATES PATENTS

| | | | |
|---|---|---|---|
| 3,654,492 | 4/1972 | Clark | 307/269 |
| 3,671,875 | 6/1972 | Pento | 328/164 |
| 3,757,051 | 9/1973 | Girard et al. | 328/164 |
| 3,952,254 | 4/1976 | Kurita et al. | 328/63 |

*Primary Examiner*—Stanley D. Miller, Jr.
*Attorney, Agent, or Firm*—Hane, Sullivan & Spiecens

[57] ABSTRACT

A device for obtaining a jitterstable synchronization of a counter which has a clock input for receiving bit timing pulses from a remote control unit, an output for supplying regenerated frame timing pulses, and a reset input comprises: a phase comparator means which has an output arranged to supply an output signal if, and only if, a lag of the leading edge or a lead of the trailing edge occurs for the regenerated frame timing pulses transmitted from the counter relative to frame timing pulses transmitted from the control unit; and a memory means which has a signal input connected to the output of the phase comparator means, a clock input for receiving the bit timing pulses and reacting to an edge opposite to the edge on which the clock input of the counter is arranged to react, and an output connected to the reset input of the counter to reset the latter in dependence on whether the output signal from the phase comparator means is supplied.

3 Claims, 2 Drawing Figures

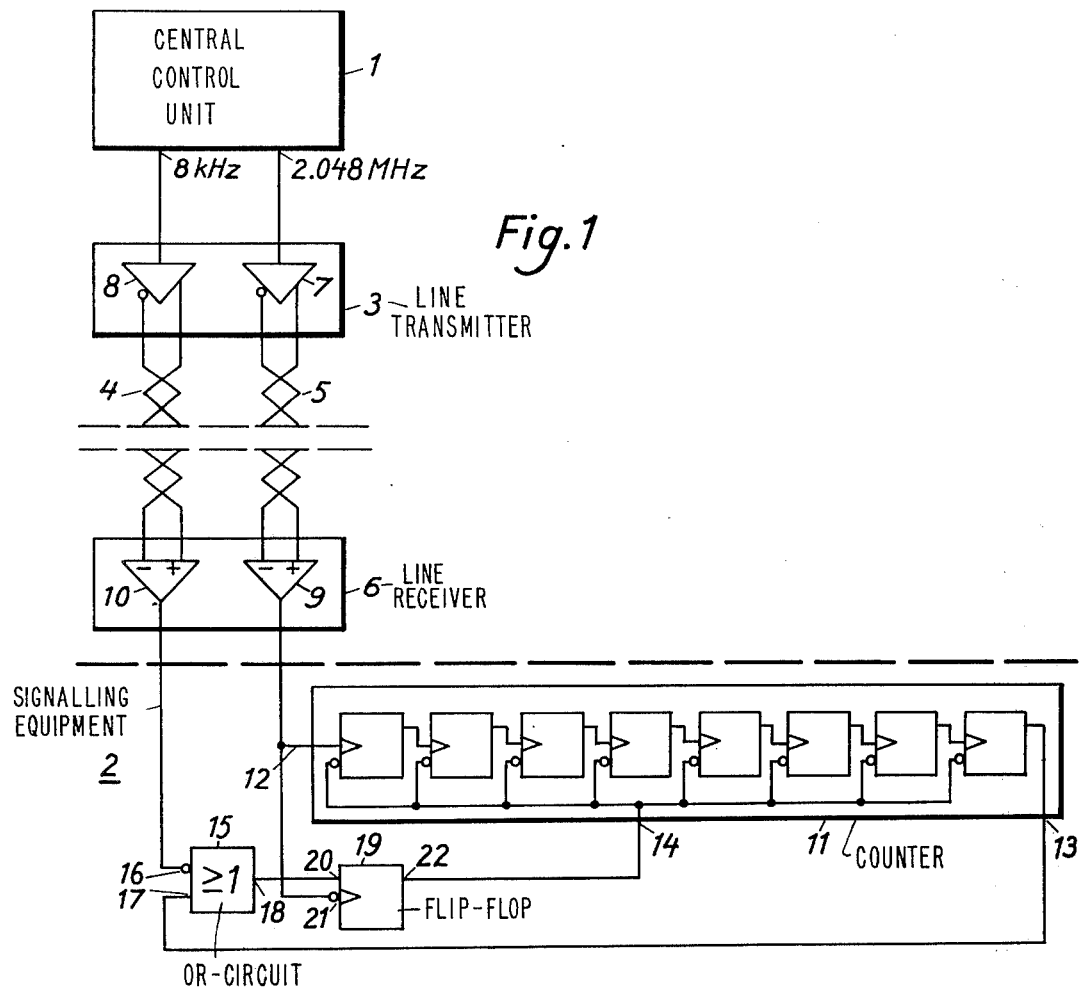
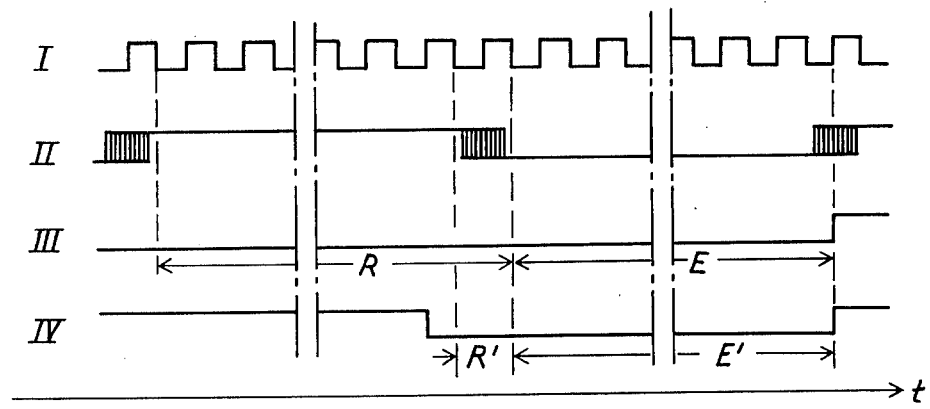

DEVICE FOR OBTAINING A JITTERSTABLE SYNCHRONIZATION OF A COUNTER

The invention relates to a device for obtaining a jitterstable synchronization of a counter to which bit timing pulses and frame timing pulses are separately transmitted from a remote control unit and which has a clock input arranged to be supplied with the bit timing pulses, an output for supplying frame timing pulses regenerated by the counter, and a reset input.

A known method for synchronizing a counter to which bit timing pulses and frame timing pulses are separately transmitted from a remote control unit, the counter being clocked by the bit timing pulses, consists in generating a synchronizing reset signal to the counter by differentiating the trailing edge of the frame timing pulses transmitted from the control unit. If the distance between the control unit and the counter is so large that jitter, i.e. phase errors, occur in the frame timing pulses relative to the bit timing pulses due to variations in their respective line circuits, the synchronization becomes unstable.

The device according to the invention obtains a jitterstable synchronization of a counter to which bit timing pulses and frame timing pulses are separately transmitted from a remote control unit. The invention is preferably intended to be used in PCM-systems when a counter in, for example, a signalling equipment is to be synchronized to a counter in a central control unit over a distance in the order of of 100 meters.

The device according to the invention, the characteristics of which appear in the following claims, will be described more in detail with reference to the accompanying drawing where:

FIG. 1 shows a transmission system which includes a preferred embodiment of the device according to the invention; and FIG. 2 shows a timing diagram which explains the operation of the device according to the invention.

FIG. 1 shows a transmission system in which PCM bit timing pulses with the frequency 2.048 MHz and PCM frame timing pulses with the frequency 8 kHz are transmitted from a central control unit 1 to a signalling equipment 2 via a line transmitter 3, two twisted line pairs 4 and 5, respectively, and a line receiver 6. The central control unit 1 can be the control unit of a PCM system having a clock which generates the bit timing pulses for the system and the frame timing pulses for the system. The line transmitter 3 of conventional design contains two phase inverting amplifiers 7 and 8 while the line receiver 6 of conventional design contains two voltage comparators 9 and 10. The signalling equipment 2 comprises a counter 11 consisting of eight conventional edge triggered flip-flops in a cascade connection. The counter 11 has a clock input 12 which is connected to the voltage comparator 9 in the line receiver 6 to be supplied with the bit timing pulses transmitted from the control unit 1, an output 13 for frame timing pulses regenerated by the counter 11 from the bit timing pulses by division with $2^8$, and a reset input 14.

The signalling equipment 2 further contains a preferred embodiment of the device according to the invention for obtaining a jitterstable synchronization of the counter 11 to the bit timing pulses and frame timing pulses transmitted from the control unit 1. The device according to the invention includes a phase comparator in the form of an OR-circuit 15 which has an inverting input 16 connected to the voltage comparator 10 in the line receiver 6 to be supplied with the frame timing pulses transmitted from the control unit 1, a non-inverting input 17 connected to the output 13 of the counter 11, and an output 18 arranged to supply an output signal if, and only if, a lag of the leading edge or a lead of the trailing edge occurs for the frame timing pulses regenerated by the counter 11 relatively to the frame timing pulses transmitted from the control unit 1.

The device according to the invention further comprises a flip-flop 19 which has a signal input 20 connected to the output 18 of the OR-circuit 15, a clock input 21 which is connected to the output of voltage comparator 9 in the line receiver 6 to be supplied with the bit timing pulses transmitted from the control unit 1 and is arranged to react on an edge opposite to the edge on which the clock input 12 of the counter 11 is arranged to react, and an output 22 which is connected to the reset input 14 of the counter 11 to reset the latter in dependence on whether an output signal is emitted from the phase comparator 15. According to the example the clock input 12 of the counter 11 is arranged to react on the positive edge while the clock input 21 of the flip-flop 19 is arranged to react on the negative edge of the bit timing pulses.

FIG. 2 shows a timing diagram which explains the operation of the device according to the invention. Lines I and II show the bit timing pulses and frame timing pulses respectively transmitted from the control unit 1. Jitter occurs at the frame timing pulses relative the bit timing pulses due to variations in their respective line circuits. In the device according to the invention the jitter may amount to almost the whole period of the bit timing pulses, as marked on line II, without the synchronizing of the counter 11 being influenced. Lines III and IV show the frame timing pulses regenerated by the counter 11 on its output 13 when the lag of the leading edge and lead of the trailing edge, respectively, occurs for them relative to the frame timing pulses transmitted from the control unit 1. An interval R and R', respectively, marks that presence of the output signal from the OR-circuit 15 occurs which inhibits a forward stepping of the counter 11 while a subsequent interval E and E' respectively marks the absences of the output signal from the OR-circuit 15 and that a forward stepping of the counter 11 takes place synchronously with the bit timing pulses and frame timing pulses transmitted from the control unit 1.

The device according to the invention presents the frame timing pulses regenerated by the counter 11 from being shortened relative to the frame timing pulses transmitted from the control unit 1 if the synchronization occasionally gets lost. This is an important feature in the device as occasional shortenings by the regenerated frame timing pulses should imply that the signalling equipment 2 in FIG. 1 would generate transients of incompleted signalling messages which disturb the normal signalling process of counteracting measures are not taken. Occasional prolongations of the regenerated frame timing pulses according to lines III and IV in FIG. 2 only causes delayed signallings which do not disturb the normal signalling process. It should be noted that if the OR-circuit 15 in FIG. 1 were replaced by an exclusive-OR-circuit, the use of which as a phase comparator is well known, the result would be precisely the undesirable shortenings of the regenerated frame timing pulses.

We claim:

1. In a system having a control unit transmitting bit timing pulses and frame timing pulses, and a counter having a clock input for receiving the bit timing pulses from the control unit, an output for transmitting regenerated frame timing pulses, and a reset input, a device for jitterstable synchronizing the counter to the control unit comprising: a phase comparator means having a first input for receiving the frame timing pulses from the control unit, a second input connected to the output of the counter, and an output for transmitting an output signal if, and only if, a lag of the leading edge or a lead of the trailing edge occurs for the frame timing pulses regenerated by the counter relative to the frame timing pulses transmitted from the control unit; and a memory means having a signal input connected to the output of said phase comparator means, a clock input for receiving the bit timing pulses and reacting on an edge opposite to the edge on which the clock input of the counter is arranged to react, and an output connected to the reset input of the counter to reset the latter when an output signal is emitted from the phase comparator means.

2. Device according to claim 1, wherein the phase comparator means comprises an OR-circuit, the first and second inputs of the phase comparator means corresponding to an inverting and a non-inverting input, respectively, of the OR-circuit.

3. The device of claim 1 wherein said phase comparator means consists of an OR-circuit having an inverting and a non-inverting input, said inverting input corresponding to the first input of the phase comparator means, and the non-inverting input corresponding to the second input of the phase comparator means.

* * * * *